United States Patent [19]

Lux

[11] Patent Number: 5,672,382
[45] Date of Patent: Sep. 30, 1997

[54] COMPOSITE POWDER PARTICLE, COMPOSITE BODY AND METHOD OF PREPARATION

[75] Inventor: Benno Lux, Scuol/GR, Switzerland

[73] Assignee: Sumitomo Electric Industries, Ltd., Osaka, Japan

[21] Appl. No.: 450,928

[22] Filed: May 25, 1995

Related U.S. Application Data

[62] Division of Ser. No. 217,018, Mar. 24, 1994, abandoned, which is a continuation of Ser. No. 980,439, Nov. 23, 1992, abandoned, which is a continuation of Ser. No. 589,039, Sep. 27, 1990, abandoned, which is a continuation of Ser. No. 324,654, Mar. 17, 1989, abandoned, which is a continuation of Ser. No. 945,557, Dec. 23, 1986, abandoned.

[30] Foreign Application Priority Data

Dec. 24, 1985 [DE] Germany .............. 34 56 113.6

[51] Int. Cl.$^6$ ...................... B05D 7/00
[52] U.S. Cl. .............. 427/213; 427/249; 51/293; 51/295; 51/309
[58] Field of Search ............ 427/213, 249; 51/293, 295, 309; 118/DIG. 5, 303, 716, 723 MW

[56] References Cited

U.S. PATENT DOCUMENTS 3,398,718   8/1968   Pilloton ..................... 118/716
3,714,334   1/1973   Vickery .
3,831,428   8/1974   Wentorf, Jr. et al. .
3,913,280   10/1975  Hall .

(List continued on next page.)

FOREIGN PATENT DOCUMENTS 0 117 542 A2   9/1984   European Pat. Off. .
0 157 212 A2   10/1985  European Pat. Off. .
0 360 305 A2   3/1990   European Pat. Off. .
0 361 542 A1   4/1990   European Pat. Off. .

(List continued on next page.)

OTHER PUBLICATIONS

Joffreau, P.O., et al., *Low–Pressure Diamond Growth on Refractory Metals*. R&HM (Dec. 1988), pp. 186–194.
Komatsu, S., et al., *Deposition of Boron Nitride Films by Chemical Transport of Boron in RF $H_2+N_2$ Plasma*. SPC-7 Eindhoven, Paper No. P–5–11 (Jul. 1985), pp. 142–145.
Recker, K., *Synthetische Diamanten*. Idar–Oberstein, vol. 33, Nr. 1/2 (Jun. 1984) pp. 5–34.

(List continued on next page.)

*Primary Examiner*—Shrive Beck
*Assistant Examiner*—David M. Maiorana
*Attorney, Agent, or Firm*—Burns, Doane, Swecker & Mathis, L.L.P.

[57] ABSTRACT

A composite powder particle, consisting of a core and a coating, and consisting either completely or partly of a superhard matter different from that of the core, and being prepared by means of a special method, at which the superhard matter is at least partly formed from a gaseous phase at sub-pressure and at temperatures below 1200° C.

14 Claims, 1 Drawing Sheet

U.S. PATENT DOCUMENTS

| | | |
|---|---|---|
| 4,137,361 | 1/1979 | Deffeyes et al. . |
| 4,148,964 | 4/1979 | Fedoseev et al. . |
| 4,225,355 | 9/1980 | Galasso et al. . |
| 4,353,953 | 10/1982 | Morelock . |
| 4,353,963 | 10/1982 | Lee et al. . |
| 4,403,015 | 9/1983 | Nakai et al. . |
| 4,415,420 | 11/1983 | Beale . |
| 4,434,188 | 2/1984 | Kamo et al. . |
| 4,504,519 | 3/1985 | Zelez . |
| 4,707,384 | 11/1987 | Schachner et al. . |
| 4,734,339 | 3/1988 | Schachner et al. . |
| 4,885,132 | 12/1989 | Brandt et al. . |
| 4,919,974 | 4/1990 | McCune et al. . |
| 4,957,548 | 9/1990 | Shima et al. . |
| 4,960,643 | 10/1990 | Lemelson . |
| 4,985,070 | 1/1991 | Kitamura et al. . |

FOREIGN PATENT DOCUMENTS

| | | |
|---|---|---|
| 0 226 898 B1 | 8/1992 | European Pat. Off. . |
| 1366544 | 6/1964 | France . |
| 2 157 145 | 5/1972 | Germany . |
| 2 059 371 | 6/1972 | Germany . |
| 3522583 C2 | 2/1986 | Germany . |
| 58-91100 | 5/1983 | Japan . |
| 58-110494 A | 7/1983 | Japan . |
| 58-135117 A | 8/1983 | Japan . |
| 58-153774 | 9/1983 | Japan . |
| 59-80775 A | 5/1984 | Japan . |
| 59-137311 | 8/1984 | Japan . |
| 60-116781 A | 6/1985 | Japan . |
| 60-149773 A | 8/1985 | Japan . |
| 60-231494 | 11/1985 | Japan . |
| 61-251506 | 11/1986 | Japan . |
| 62-57568 | 1/1987 | Japan . |
| 63-216941 | 9/1988 | Japan . |

OTHER PUBLICATIONS

Matsumoto, Seiichiro, et al., *Growth of Diamond Particles from Methane–Hydrogen Gas. Journal of Materials Science,* 17 (1982), pp. 3106–3112. no month.

*Method of Synthesizing Diamonds Under Low Pressure,* Technocrat, vol. 15, No. 5, May 1982.

Spitsyn, B.V., et al., *Vapor Growth of Diamond on Diamond and Other Surfaces. Journal of Crystal Growth,* 52 (1981), pp. 219–226 no month.

Vora, H. and T.J. Moravec, *Structural Investigation of Thin Films of Diamondlike Carbon. Journal of Applied Physics,* 52 (1981), No. 10, pp. 6151–6157 no month.

Moravec, T.J., *Color Chart for Diamond–like Carbon Films on Silicon. Thin Solid Films,* 70 (1980), pp. L9–L10 no month.

Derjaguin, B.V., et al., *Growth of Diamond Films on Its Own and Foreign Surfaces. G. Int. Konferenz f. Kristallzeichtung,* Moscow 1980, Extended Abstracts, vol. 1, pp. 307–309 no month.

Diehl, R., *Diamantsynthese bei Temperaturen unter 1300° C. und Drucken unter einer Atmosphäre. Z. Dt. Gemmol. Ges.,* 26 (1977) 3, pp. 128–134 no month.

Varnin, V.P., et al., *Growth of Polycrystalline Diamond Films from the Gas Phase. Sov. Phys. Crystallogr.,* 22(4) (Jul. Aug. 1977), pp. 513–515.

Chauhan, Satya P., et al., *Kinetics of Carbon Deposition on Diamond Powder. Journal of Applied Physics,* vol. 47, No. 11 (Nov. 1976), pp. 4746–4754.

Deryagin, B.V., et al., *Growth of Polycrystalline Diamond Films from the Gas Phase. Sov. Phys. JETP,* vol. 42, No. 4 (1976), pp. 639–640 no month.

Poferl, David J., et al., *Growth of Boron–doped Diamond seed Crystals by Vapor Deposition. Journal of Applied Physics,* vol. 44, No. 4 (Apr. 1973), pp. 1428–1434.

Angus, J.C., et al., *Growth of Diamond Seed Crystals From the Vapour at Sub–atmospheric Pressure. Journal of Applied Physics,* vol. 39, No. 6 (May 1968), pp. 2915–2922.

Schmellenmeier, Heinz, *Kohlenstoffschichten mit Diamantstruktur.* Exp. Techn. Phys. 1 (1953), pp. 49–68 no month.

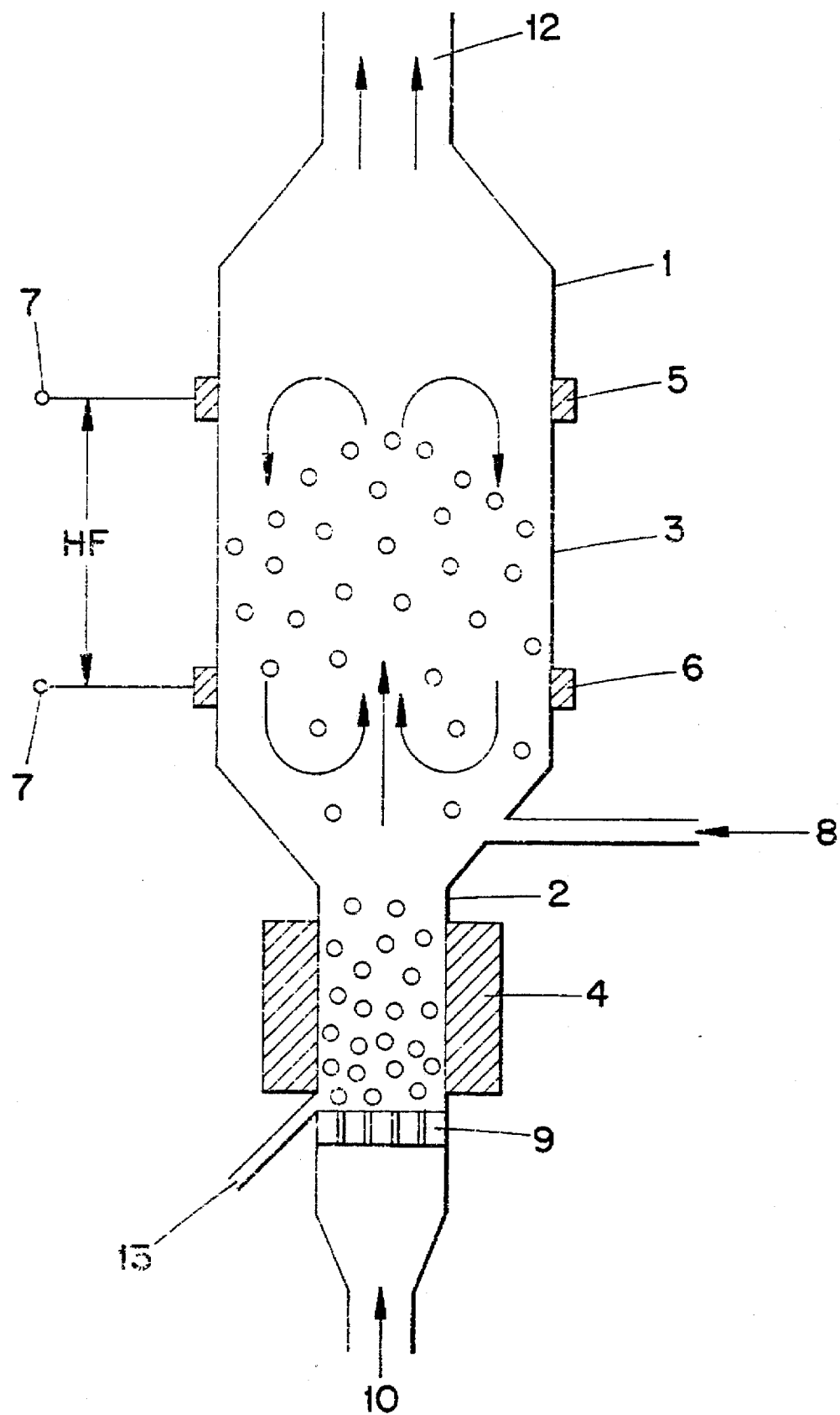

COMPOSITE POWDER PARTICLE, COMPOSITE BODY AND METHOD OF PREPARATION

This application is a divisional, of application Ser. No. 08/217,018, filed Mar. 24, 1994, abandoned, a continuation of application Ser. No. 07/980,439, filed Nov. 23, 1992, now abandoned, which is a continuation of application Ser. No. 07/589,039, filed Sep. 27, 1990, now abandoned, which is a continuation of application Ser. No. 07/324,654, filed Mar. 17, 1989, now abandoned, which is a continuation of application Ser. No. 06/945,557, filed Dec. 23, 1986, now abandoned.

BACKGROUND OF THE INVENTION

This invention relates to a composite powder particle consisting of an inner core, which is enclosed by an adherent coating, and to a method of making said composite powder particle.

Multiple-phase composite powder particles have been known for a long time. For example, graphite particles enclosed by thin copper or nickel layers, diamond powders enclosed by, for example, thin nickel or copper layers and uranium oxide particles enclosed by pyrolytic carbon or SiC-layers are described in the literature.

The advantage of such composite powders is that when used as powder they show certain surface properties which are different to those of the core material, or by pressing and sintering they can be worked to multiphase bodies which have special properties.

Methods of making such powders are, for example, chemical or electrolytic deposition from aqueous solutions and salt melts, respectively or depositions from the gas phase.

Also, epitaxially deposited diamond layers upon diamond powders were described some time ago with the goal to increase the weight of the diamond powder. Particular changes of the physical and chemical properties of the diamond powder were not intended (S. P. Chauhan, J. C. Angus, N. C. Gardner: J. of Appl. Phys. 47, 1976, pages 4746 to 4754).

For the preparation of diamond layers, new methods of deposition of diamond in the metastable range at subpressure, have been described in the literature (K. Recker: Z. Dt. Gemmol. Ges. Nr. 1/2, 1984, 5/34).

Also the preparation of superhard BN by analogous methods is mentioned in the literature (S. Komatsu, K. Akashi, T. Yoshida, Paper number P-5-11, Proceedings of the JSPC-7 Eindhoven, July 1985).

SUMMARY OF THE INVENTION

The basic purpose of this invention was to obtain various useful powders with improved properties.

This problem is solved by composite powder particles having the earlier mentioned features characterized in that the coating at least partly consists of a superhard material which is different from the core. Preferably, regarding the coating is a closed, continuous layer without any discontinuities on the core.

According to a preferred embodiment, the coating consists partly of a superhard material which is chemically different from the material of the core.

Superhard materials are understood to be materials having a hardness of more than 3500, preferably more than 4500, particularly more than 6000 Vickers, which materials preferably mean modifications of carbon, boron nitride and other phases of the ternary system B, N, C of which said elements are the main constituents. Some of the phases or compounds in said systems can reach said hardness alone while others can be mixtures, transitional structures, crystal lattices with interstitially ordered atoms, mixed crystals or crystal structures having a great amount of lattice defects.

Furthermore, it is suitable that the inner core is a mono- or polycrystalline particle of a superhard modification of boron nitride or a hard material which does not react or reacts very little with carbon and/or boron nitride at temperatures up to 1000° C. and does not dissolve or dissolves said materials very slowly up to said temperature. The hard material consists of a carbide, e.g. SiC, $B_4C$, WC, TiC, TaC, a nitride, e.g. TiN, TaN, ZrN, AlN, $Si_3N_4$, a boride, e.g. $TiB_2$, $TaB_2$, WB, a phosphide, e.g. BP, a sulphide, e.g. CaS, CeS, a silicide, e.g. $MoSi_2$, $TiSi_2$, an oxide, oxynitride, oxycarbide, oxycarbonitride, e.g. $Al_2O_3$, AlNO, AlCON, Ti(C,O), Zr(C,N,O), a NOSC=(Non-Oxide-Silicon-Ceramic), SiAlON, or an inorganic material with normal hardness and which does not react or reacts only slowly with carbon and/or BN or which does not dissolve or dissolves very little carbon at temperatures up to 1000° C. Examples of the latter are metals as Cu, Ag, Au, alloys, intermetallic phases, compounds such as oxides and oxide mixtures, silicates, aluminates, spinels, sulphides, carbides, nitrides, carbonitrides, oxycarbides, silicides, borides, oxycarbonitrides, hydrides, aluminides, ferrites or inorganic salts, mixed crystals of said materials or a solid reaction product which is present spontaneously in the reaction system and acts as a heterogenous crystal nucleus.

According to another preferred embodiment the outer coating comprises several layers, at least one layer of which consists of mono- or polycrystalline diamond and/or another superhard carbon modification or a superhard modification of boron nitride or a superhard binary or ternary phase of this system B, N, C and in which said superhard materials form a continuous adherent layer.

Furthermore, it is suitable, when both the core and the coating consists of diamond and/or another superhard carbon modification and/or a superhard BN modification, that they are different chemically and/or physically in their structure and/or in their properties.

It can also be suitable, that the core is so small that it can be considered as a homogeneous or heterogeneous nucleus for the crystallization of the superhard material from the supersaturated gas phase.

Contrary to the composite powder bodies already described in the literature which always contain the superhard part merely in the center, it is now possible according to the invention to apply superhard materials as thin layers in the outer coating of the powder composite body also when the core does not consist of diamond. With certain, later on more closely described limitations, the core can be freely chosen among a large range of materials. The core can also consist of a superhard material, which, however, is more or less different from the outer superhard layers of the coating regarding its chemical composition and/or its physical and/or chemical properties.

BRIEF DESCRIPTION OF THE DRAWING

The FIGURE is a diagram of an apparatus used to perform the instant invention.

DETAILED DESCRIPTION OF THE PREFERRED EMBODIMENTS

A range of combination possibilities exists for powders consisting almost completely of superhard materials.

1st combination: Monocrystalline superhard core with monocrystalline superhard coating having different chemical and/or physical properties relative to the core Even if the coating with a superhard material according to the invention is normally not monocrystalline, this can be achieved particularly if the core also consists of a monocrystalline particle and the layer on said core shows an epitaxial growth. Said growth of the coating layer is not uniform, however. Its thickness is correlated with the core crystal surfaces and varies depending upon the base surfaces. This means that certain crystal surfaces and crystal orientations will be thicker coated and others thinner coated. High-index surfaces are normally more thicker coated. Crystal equilibrium forms with low index surfaces appear therefore preferably in the outer figure and may strongly determine the outer form (Habitus) of the powder particles.

2nd combination: Superhard core and chemically similar but polycrystalline, superhard coating For example, the preparation of superhard boron nitride layers with special physical properties upon a mono- or polycrystalline superhard boron nitride core is possible. Such composite powders are not only of interest for the further working to a sintered product but are also usable as the powder itself.

The method also can be used to form diamond as a coating on superhard boron nitride cores by a gas phase reaction without high pressure.

Likewise, it is possible for a monocrystalline core to have a polycrystalline layer instead of a monocrystalline coating, which for example, when being used as powder is particularly handy for grinding or polishing. Thus, a partly epitaxial relationship between the core and the grown layer can be maintained.

The coating is, however, generally different from the core even when the same chemical matter (BN or carbon) is used, e.g. in their chemical composition, in their physical properties, in their internal structure, e.g. the number and kind of the inclusions of crystal defects and their dimensions. In the case when the core and the coating consists of the same superhard material, there is often no difference in the crystal structure but the chemical composition and/or the physical and/or the chemical properties of the coating can be purposely and considerably changed in order to obtain certain properties. This may in extreme cases even lead to a change of the crystal structure (e.g. diamond transforms to lonsdaleite), which, however, takes place only in exceptional cases and is not necessary to obtain the desired changes of the properties.

If the coating is different from the superhard core only regarding the chemical and/or the physical properties, but not regarding its crystal structure, e.g. in the case of a diamond core and a diamond coating or a coating of another superhard carbon modification, special properties of the obtained diamond powder can be obtained by changing the composition or the physical structure of the outer coating. The weight increase of the diamonds because of the material growth is not important—contrary to similar methods already described in the literature—because of the advantages of the new properties.

It is thus possible either to change the physical and/or chemical nature of the outer coating by chemical additions (doping), or to change the properties so that they are clearly different from the original cores by certain precipitation conditions during the formation of said superhard diamond layers (changing the number of nuclei and growth rate by variation of precipitation temperature or a certain saturation of the gas space by the reacting components or by a certain influence (acceleration) of the ions, etc.). It is further possible by this method to obtain defective and distorted crystal lattices which strongly deviate from the ideal diamond crystal up to transition forms which show, for example, inclusions of lonsdaleite, i.e. pronounced stacking faults of the lattice and even up to structures which belong to the carbine groups or show partly amorphous structures.

By various coating conditions it is possible to obtain changes of properties, which clearly differentiate the coating from the used, relatively well crystallized, cubic diamonds, for example:

1. Change of the optical properties:

Color, e.g. blue (by B-additions), yellow-transparent (by $N_2$) or brown up to black (by various degree of cleanliness or impurities, e.g. by elements such as Ni, Fe, Mn, etc.). Connected herewith are, e.g. light refraction, light reflection, light scintillation properties, X-ray-, thermo-, electro- and cathodoluminenscence, e.g. with various donor- and acceptor centra, which are formed because of doping and/or growth defects, abnormal double refraction, photo conductivity, UV- and/or IR-absorption or fluorescence and phosphorescence.

2. Change of the mechanical, thermal, morphological and other properties, such as, e.g.:

density, hardness, strength, E-modulus, clearability, wear resistance and wear strength, thermal conductivity, formation of certain crystal facets, e.g., exclusively octahedral surfaces or cubic surfaces by additions of Mn, Zr, platinum metals, etc. or (113) facets, e.g. by boron additions, as often observed on Ge and Si crystals, type I diamonds and Ia or Ib like diamonds with high N-contents or other specific impurities, respectively, or type II and type IIa or IIb diamonds, respectively, e.g. by particularly low contents of nitrogen.

3. Changes of electrical properties, such as:

electrical conductivity, semi-conductor property of p-type (e.g. by B-, Al- or similar addition or addition of free carbon) with certain pressure and temperature dependences, semi-conductor properties of n-type, e.g. by alloying with nitrogen, P, As, Sb or Li as interstitial lattice donors and other suitable elements.

4. Change of chemical properties, e.g.:

wettability by liquid metals, alloys etc., wettability by oxide and silicate melts, surface reaction rates with chemical matters, e.g. chemical resistance to oxidizing media such as oxygen, salt melts, etc. or reducing media such as $H_2$, CO etc., transition kinetics (rate) at heating above 500° C. of the superhard metastable modification into the stable modification.

When superhard boron nitride is the coating, there can be obtained property changes as items 1–4 above. For example, by the addition of 0.01 to 5 atomic-% S and/or Se and/or Te, preferably by addition of 0.15 to 0.3 atomic-% of said elements, semi-conductor properties with an activating energy in the range of 0.01 to 0.5 eV, preferably 0.1 to 0.2 eV, by addition of 0.001 to 2 atomic-%, preferably 0.05 to 0.5 atomic-% Sb p-type semi-conductor can be obtained.

Many of the described changes of properties can take place partly separately, partly jointly and make possible a great expansion of the usability of the composite powder with diamond or superhard BN coatings, respectively.

All the mentioned changes of properties of the diamond- or BN-layer(s) respectively formed in the coating can be used not only for diamond or BN-cores respectively but also for all other mentioned core materials.

It is also possible to apply such modified diamond layers or BN-layers with particular properties as so called "coatings" on larger compound bodies, which are not powder shaped. The substrate shah not consist of diamond. The practical use of said composite bodies can be directly utilized, i.e. without the necessity of pressing the powder, also for large bodies because of the particular properties of the applied diamond coatings, which means an expansion of the possible uses mentioned in patents. For the substrates of said compound bodies, the later described embodiments regarding the kind of the core of the particles are applicable.

3rd combination: Composite powder particles consisting of at least two chemically different superhard materials as core or coating (e.g. diamond core with BN layer or vice versa)

The combination of different superhard materials in one composite powder particle has up to now not been possible because suitable methods of forming a layer were not available. Of particular interest is, e.g. the combination of superhard boron nitride and superhard diamond because the two superhard materials are essentially different in regard to their polishing, grinding and cutting properties, e.g. in steel, aluminum, stone and other materials. The core is a mono- or polycrystalline superhard modification of carbon and the coating is one or several mono- or polycrystalline phase(s) of superhard boron nitride, or vice versa. All other superhard materials defined earlier and having a hardness above 3500 Vickers can also be arbitrarily used.

4th combination: Superhard core with a superhard polycrystalline layer (chemically equivalent or different) as well as inclusion of its stable phases in the grain boundaries A further possibility is that particularly in the polycrystalline layers besides the superhard and metastable phases, the normal stable phases of the same chemical composition can also be obtained in certain amounts. For example, a coating layer of polycrystalline diamond can contain in the grain boundaries according to the way of manufacturing, certain amounts of graphite and/or other amorphous carbon. This is advantageous for example, in uses where the powder particles are compressed afterwards to a larger body. Said graphite amount contributes to a particularly tight packing of the compact before the high pressure transformation to diamond, because it makes possible in the first moment of the compaction a sliding of the bodies which leads to an optimal compression. As the graphite is finely distributed, it is particularly favorable in this action and better suited than the normal added graphite amounts.

Also, in certain direct uses of the composite powder for grinding and polishing, the graphite amount has a positive influence on the grinding and polishing effect because of its sliding properties and its particular distribution in the composite body has a positive influence on the procedure of the surface smoothing.

Analogous examples are valid for the superhard cubic and hexagonal boron nitride phases, respectively, and the amorphous or the normally hexagonally appearing soft layered lattice of boron nitride. Also, the simultaneous formation of these non hard material phases can be controlled by suitable process conditions.

5th combination: Core with one or more outer superhard layers alone or with additional normal layers or hard material layers For example, the combination of one or more superhard materials with such hard materials, which partly already today are industrially used for polishing or grinding (e.g. aluminum oxide, silicon carbide, boron carbide, etc.), can be of particular advantage.

The core only can be a normal hard material with a single superhard material as the coating, or there can be applied several superhard layers also with normal materials or hard principal layers as intermediate layers. In the latter case, e.g., the usability of the superhard materials, which were applied in the coating in several layers, is increased by a kind of self sharpening because the hard, but compared to the superhard material relatively soft, hard principals are torn off quicker. In this way, the superhard material will always offer a sharp cutting edge for the polishing or grinding work. By applying the superhard and hard layers in alternating sequence, said effect is particularly pronounced. It is important that the thickness and the hardness of the respective layers have an optimum relationship. The thinner the superhard layer, the harder the intermediate layer of hard principals has to be, so that the otherwise too rapid wear of said layer does not lead to breaking and cracking of the superhard layer.

The multilayer coating of alternating superhard materials makes also a particularly fine grained distribution possible after the pressing and/or sintering into a larger composite body.

Also, the particular chemical resistance or other surface properties of the superhard material can be used in said connection.

By pressing of said multilayer composite, e.g. particularly when as outermost layer there is used a certain layer chosen with respect to its chemical resistance and wettability, the usual advantages of multiphase composite powder particles, such as good wettability or good cold weldability or particular resistance to liquid phases in the preparation, etc., can be optimally used.

6th combination: The core consists of an extremely small nucleus on which the superhard material is grown Said nucleus can consist of a different kind of material and be so small that it in practice only with difficulty can be made visible (that is, a heterogenous nucleus). It can also mean the same kind of material and only consist of a very defective crystal lattice of the superhard material itself (that is, a homogeneous nucleus).

In the following there are listed some examples showing several further combinations of materials. Thus, according to the invention, a composite powder particle is prepared consisting of an inner core—being quite variable in its nature and its size—which is enclosed by an adherent, preferably firmly adherent, outer coating. Said coating consists completely or only partly of a superhard material and is variable within broad ranges regarding its dimensions and choice of non superhard intermediate layers. Such intermediate layers can in principle be chosen from the same matter as the following described core materials.

The core is either a superhard material, consisting of a monocrystalline diamond or lonsdaleite or another monocrystalline superhard carbon modification, a polycrystalline diamond or lonsdaleite or another polycrystalline carbon modification, a monocrystalline superhard modification of boron nitride, a polycrystalline superhard modification of boron nitride or a hard material, which at temperatures up to 1000° C. does not react or will react only slowly with carbon and/or BN or does not dissolve or will only slightly dissolve carbon, such a hard material can be a carbide, e.g., $SiC, B_4C$, WC, TiC, TaC, etc., a nitride, e.g., TiN, TaN, ZrN, AlN, $Si_3N_4$, etc., a boride, e.g., $TiB_2, TaB_2$, WB, etc., a phosphide, e.g., BP etc., a sulphide, e.g., CaS, CeS, etc., a silicide, e.g., $MoSi_2$, $TiSi_2$, etc., an oxide, oxynitride, oxycarbide, oxycarbonitride, e.g. $Al_2O_3$, AlNO, AlCON, Ti(C,O), Zr(C, N,O) etc., a NOSC (=Non-Oxide-Silicon-Ceramic) or SiAlON, etc., or an inorganic material with normal hardness which at temperatures up to 1000° C. does not react or will react only slowly with carbon and/or BN or does not dissolve or will only slightly dissolve carbon, such an inorganic material can be metals like Cu, Ag, Au, etc., or alloys or intermetallic phases(s) mixtures such as silicates, aluminates, spinels, etc., or sulphides, carbides, nitrides, carbonitrides, oxycarbides, silicides, borides, oxycarbonitrides, hydrides, aluminides, ferrites, etc., or oxide mixtures or inorganic salts or multiphase mixtures of said materials and mixed crystals of said materials, respectively, or a solid material which means a reaction product which appears spontaneously in the reaction system and serves as a heterogeneous crystal nucleus.

The composite powder particle is further characterized in, that the coating has at least one layer of a superhard matter, in which the core, for example, consists of one of the substances listed above and the outer superhard coating has been epitaxially grown on a monocrystalline core or any crystallographic relationship being missing between the core and the first coating. Transition forms between the two extremities can be present to any extent or the polycrystalline coating or the superhard material can contain the same material which is present in its stable modification in the grain boundary. When the superhard material is diamond or lonsdaleite or another superhard carbon modification, additionally, either graphite and/or amorphous carbon occurs. When the material is a superhard modification of boron nitride, additionally, either soft hexagonal and/or amorphous BN occurs. The outer coating may consist of several layers of which at least one consists of crystalline or polycrystalline diamond and/or lonsdaleite and/or another superhard carbon modification, said layers forming a continuous coating. The outer coating may also consist of several layers, of which at least one consists of monocrystalline modifications of superhard boron nitride, said layers forming a continuous coating. The outer coating may also consist of several layers which contain regularly ordered, alternating transition layers of diamond and/or superhard boron nitride, in which varying irregularly sequenced diamond layers as well as superhard boron nitride layers can be used. Also, the outer layers of diamond and/or superhard BN-layers and/or other superhard binary or ternary phases of the system B,N,C also can contain other layers as intermediate layers (for example the above mentioned inorganic core materials) in the coating of the composite particle.

The dimensions of the composite body particles as well as the size of the core and coating(s), respectively, can be varied within broad ranges. For example, the diameter of the inner core particle for certain powders which ordinarily is in the range of conventional powders diameters for superhard powders can by using purposely chosen process conditions and nucleus formation due to homogeneous nucleation or spontaneously formed reaction products (homogeneous nuclei) from the strongly supersaturated gaseous phase be very much smaller than 0.01 µm a size which is difficult to prove by usual scientific methods. If the diameter of the inner core particle has a size of 0.01 µm to 100 µm, but preferably between 1 and 10 µm, the outer diameter of the composite powder particle is between 1 µm and several 1000 µm, but preferably between 10 and 100 µm, the separate layers of the outer, continuous coating have a thickness between 0.1 and 5000 µm, but preferably between 1 and 5 µm.

Also, the structure can vary. For example, the outer layers of the coating can be applied in a certain sequence and have an ordered and regular relationship to each other, the layer thicknesses of the superhard material in the outer coating being in the range between 1 and 5 µm, with the hard material layer thickness being only about one half to one tenth of said superhard material layer thickness. The layers of the superhard materials in the coating have thicknesses between 100 and 500 µm, with the layer of the hard material being about as thick as the layer of the superhard material.

The composite powder particle according to the invention is suitably prepared by a fluidized bed method in combination with a gas phase deposition method. The method has, however, to be modified so that the gas flow, which holds the powder particle in fluidized bed motion, by a suitable pre-treatment contains a reactive and excited amount of gas, which prevents the formation of the soft, and in the pressure and temperature range of the method, thermodynamically stable phase instead of the metastable superhard phases. In particular, for example in the preparation of a diamond, a correspondingly high amount of a reactive atomic hydrogen atom in the gas as well as the formation of carbon radicals and corresponding ions, respectively, is important because otherwise the diamond does not form and the formation of undesirable soft graphite or carbon phases cannot be prevented and controlled.

Similar conditions are applicable in the preparation of superhard boron nitride phases. By a suitable gas excitation, the boron containing gas molecules and/or a second gas such as, e.g., hydrogen, halogens or mixtures thereof, has to be brought to such a state that the formation of hexagonal boron nitride phase or amorphous phases can be restrained or controlled and the superhard phases deposited as the main or only constituents.

In the case of composite bodies, a fluidized bed is not used but the substrates are placed in the reaction room.

The above mentioned excitation and preparation of the corresponding aggressive gases ($H_2$, halides, etc.) and the modification of the boron and carbon compounds, respectively, is successful by the use of methods which break up the gaseous molecules or atoms and provides short lived ions, radicals or atomic gas species. It can be done in various ways, for example by heating, e.g. by means of a glowing metal surface, e.g., a Ta- or W-wire, -tube, or net with corresponding high temperature, by gas discharges at sub-pressure started by direct or alternating currents, by the use of a cold plasma, made by electromagnetic waves, preferably in the mega- and gigahertz range, by ultra sonic and pressure change, respectively, by the use of completely chemical methods, such as, e.g., decomposition of HI or HBr by light by which the formation of atomic hydrogen and halogens is forced through. If materials are used which as final product form a solid or liquid phase at reaction temperature, they can appear as cores (heterogeneous nuclei) of the superhard matter.

Such excitation methods are partly obtained in the above mentioned patents and are partly also described in the prior literature.

Chemical Vapor Deposition (CVD) methods are particularly suitable as fluidized bed methods or CVD-methods with upstream reactors in which the excited state of the gases, before the particles reach said state, for example, in the fluidized bed, is not too much lost. Furthermore, the gas molecules when returned to their normal state, after their reaction or not used, reach the lowest possible concentration in the fluidized bed. This means that they must be removed so fast that they do not disturb the desired reaction. The fluidized bed construction has therefore to be optimally adapted to the holding time of the gases and the kinetics of the deposition reactions.

Among other methods of obtaining composite powder particles by means of a chemical gas phase reaction, is a method with a special CVD reaction in an upstream or fluidized bed reactor, in which particles are held in movement and can be coated in a gas flow.

The above methods for the preparation of the powder composite particles are characterized in that they fully or partly utilize a special CVD-method, suited for the preparation of superhard matters in which there is used:

a gas flow consisting of $CH_4$ or another gaseous or vaporous carbon compound as well as atomic and molecular hydrogen, as well as corresponding ions and radicals, which can be formed from the initial components;

a gas flow consisting of a gaseous or vaporous boron compound and solid and liquid boron compounds, respectively, (e.g., boron halides, boranes, borazines, B—Mg, B—Al-compounds)—with or without atomic and molecular hydrogen—and atomic nitrogen, as well as corresponding ions and radicals, which can arise from the initial components, a gas flow consisting of a gaseous or vaporous boron compound (e.g., boron halides, boranes, borazines, B—Mg-, B—Al-compounds, etc.)—with or without atomic and molecular hydrogen—as well as atomic and molecular nitrogen and/or atomic and molecular halogen or compounds of said elements, as well as ions and radicals which can arise from the initial components; and a gas flow which contains a gaseous or vaporous compound, having besides other atoms, boron- and nitrogen atoms, as essential constituents, decomposing to BN at high heating, the gas or vapour containing in connection with other atomic and molecular gases, such as hydrogen and/or nitrogen and/or halogen and/or noble gases and compounds of said elements, respectively, as well as ions, radicals and/or atomic species which can arise from the initial components of said mixture.

When in the specification or claims, the term "gaseous or vaporous carbon compounds" is used, organic compounds with hydrogen and/or oxygen and/or nitrogen and/or sulphur and/or phosphorus are included.

The method is further characterized in that the temperature range in which the moving powders are coated is between 500° and 1200° C. The coating is performed in the pressure range below 500 Torr, preferably in the range between 0.5 and 50 Torr, at which the process can be done in a discontinuous or continuous operation.

A special use of the composite powder particles obtained by the method according to the invention is as follows: In order to obtain a powder of the superhard materials of the coating, such as diamond or boron nitride powder, the cores of the composite powder are selectively dissolved by a chemical etchant, possibly after disintegration, so that precipitated superhard material remains as powder.

There are numerous possibilities to choose substances for the above mentioned cores which chemically more easily dissolve than the superhard matters being precipitated thereon.

Superhard diamond powders being obtained in this way, may be different from normal diamond powders as follows:

a) by an increased number of lattice faults present in this diamond powder compared to high pressure or natural diamonds;

b) because of particular crystal habitus surfaces, which form only or increasingly at the plasma-deposited powders and possibly do not appear at natural diamonds or high pressure diamonds;

there are, for example, in these powders certain amounts of particles having a penta-symmetrical construction and/or cubic octahedron and/or cubic octahedron with a twin plane and/or Wulff-polyhedron and/or pentagon-dodekahedron and/or various twin growths of said crystal morphologies;

c) by unintentional doping elements, arising from the method, e.g. small contents of hydrogen (more than 0.01 ppm, less than 1000 ppm, preferably between 1 and 100 ppm) at least after the preparation (i.e., without any particular vacuum- or heat-treatment);

d) by intentionally added doping elements (see list of impurities in the specification above);

e) by a lowered activation energy for the electrical conductivity compared with high pressure diamonds, e.g., by B addition in diamonds of 0.013 eV compared to 0.15 to 0.3 eV for high pressure diamonds; and f) by a $C^{12}/C^{13}$ ratio being enriched of $C^{13}$ and different to that of natural diamond.

The appended drawing shows schematically an apparatus for accomplishing a method of making the composite powder particle according to the invention.

The apparatus consists of a reactor 1 with a preheating area 2 and a reaction area 3. The preheating area 2 is surrounded by a heating furnace 4 and is formed as a tube which widens in the direction towards the reaction area 3. The lower end of the preheating area 2 forms a distributor plate 9, such as a sintered plate, being permeable to gas but not to the particles to be coated. In the preheating area 2 a fine powder (nuclei) is present. There can additionally be introduced coarser, neutral powder, which preferably serves for heat transfer and is so coarse that it can not be blown from area 2 to area 3.

In the lower part of the reaction area 3 there is a supply tube 8 for the supply of carbon compounds, boron compounds or other reaction gases, while in the lower end of the reactor 1 below the distributor plate 9 there is provided an arrangement 10 for supplying heated reaction gas (e.g. hydrogen) with or without an addition of a carrier gas, such as helium or argon.

The reaction area 3 is surrounded by two coils 5 and 6, to which at point 7 a high frequency voltage is applied and by which a plasma is excited in the reaction area.

The top end 12 of the reaction area 3 is formed by a gas outlet, through which also the particles to be coated are filled. At the lower end of the preheating area 2 there is an arrangement 13 being closed during the reaction for intermittent removal of finished coated composite powder particles.

The apparatus shown in the FIGURE works as follows:

Through the top end 12 of the reactor 1 the powder serving as cores is provided and falls in the pre-heating area 2 on the distributor plate 9. Through the inlet 10, preheated hydrogen gas only or mixed with helium (carrier gas) is provided in such amounts that a dense fluidized bed of particles is formed above the distributor plate 9 in the pre-heating area 2. This bed is heated by the furnace 4.

From the pre-heating part, the powder particles get into the widened reaction area 3 by the upwardly streaming gas by which they flow upwards in the middle of the gas room. Because of the small gas flow rate in the reaction area 3, the particles in the outer portion of the reaction area 3 fall down again. Through the applied high-frequency voltage a plasma is excited. Simultaneously, evading the pre-heating part, there are provided through the inlet 8 gaseous or vaporous carbon compounds. These carbon compounds are brought by the carrier gas/hydrogen gas flow in the reaction area, and mix in the latter whereby the coating reaction takes place in the excited plasma. The applied high frequency voltage on the source 7 is, for example, 80 MHz.

The coated particles in the reaction area 3 fall back into the pre-heating area 2 and the dense fluidized bed there. It should be mentioned that the density of the particles of the fluidized bed in the reaction area 3 is considerably smaller than the density of the particles of the fluidized bed of the pre-heating area 2.

The reaction gases and the carrier gas, mixed with each other, leave the reactor 1 through the top end 12.

The apparatus shown in the drawing works by batch processing. When a sufficiently thick layer has been applied as coating on the particles, the gas flow through the inlet 10 and the inlet 8 is interrupted and the finished composite particles are taken away through the outlet 13 from the pre-heating zone.

A particular advantage of this device is that the used gases are in contact with the particles only for a short time and are quickly removed from the reaction part, because a high gas flow rate is necessary in order to maintain the so called pneumatic fluidized bed.

The apparatus can naturally also be designed for continuous production. In that case, on the top end 12 of the reactor there is applied a cyclone which separates enclosed particles from the used gases and leads them back to the lower area of the reaction area 3 by a recycling conduit not being shown. Also, the removal of particles through the outlet 13 can be continuous. Naturally also several similar devices can be connected after each other in order to apply different or similar layers after each other on the core. It is thereby also possible to compensate for the increase in sinking rate at constant gas flow related to the coarsening of the particles. The separation of the larger particles from the smaller particles takes place in the cyclone. Only the fine particles return to the reactor whereas the coarser fraction will be further coarsened by a second reactor with other flow rates. In this way, each grain fraction will be optimally coated.

EXAMPLE 1a

Test Conditions 100 g diamond powder, 0.5 μm mean grain size, well crystallized, hydrogen with 0.5% methane.
gas flow 20 cm$^3$/min
temperature of Ta glow wire net 2100° C.
temperature of fluidized bed 750° C.
gas pressure 20 Torr
reaction time 20 h
Support of the fluidized bed with 50% addition of other gas (not in examples 1c and 1e) by which a gas flow of about 50 cm$^3$/min arises.

Test Procedure

Feeding the fluidized bed apparatus with diamond powder. Heating the fluidized bed under hydrogen, with short etching periods (10 min) with pure $H_2$ using additionally a glowing tungsten glow wire net, with mixture of methane 0.5%.
Test time 20 h.

Result

Monocrystalline coating grown on the original 0.5 μm grains up to a diameter range between 10 and 20 μm, mean grain size 16 μm.

EXAMPLE 1b 0.01% borane (boron hydride) was added to the gas. The result is almost identical. The outer coating of the coated diamond powder is doped with boron and has corresponding electrical properties.

EXAMPLE 1c

Flow increased to 200 cm$^3$/min and $CH_4$ concentration to 2%.
Result: Polycrystalline layers grow instead of monocrystalline layers. Layer thickness increased about 3 to 4 times.

EXAMPLE 1d

Instead of monocrystalline 0.5 μm powder particles as starting material polycrystalline ballas-diamonds were used. Initial grain size 5 μm.

The higher gas speed and the higher $CH_4$ concentration of Example 1c are used.

Result: There is obtained a polycrystalline diamond layer with special properties and an increase of the diameter of the ballas (carbonados) diamonds on an average of 20 μm in the test time of 20 h.

EXAMPLE 1e

Initial material ballas-diamond, all test conditions the same, but a further increase of the methane content to 3% during a small decrease of the temperature of the Ta wire to 2000° C.

Result: Ballas-diamonds coated by polycrystalline diamond layer with about 10 to 20% intermediately deposited graphite and amorphous carbon in the grain boundaries and on the outer surface of the grown diamonds.

EXAMPLE 2

Identical test conditions with the examples 1a to 1c, but using SiAlON as core material instead of diamond.
Grain size 20 μm.

EXAMPLE 3

Use of cubic boron nitride as core instead of diamond, otherwise analogous to Examples 1a to 1e.

EXAMPLE 4

Preparation of Multilayer Superhard Matter Composite Body

Test conditions: close to Example 2:

In this connection there was changed to another excitation source with microwaves 4.8 GHz. New gases consisting of 1% borane, 2% ammonia, rest hydrogen and small additions of fluorine were introduced. During 5 h superhard boron nitride is deposited.

In this connection it is re-connected to the gases necessary for diamond and by 2% $Si_2H_6$ with 2% ammonia and the rest being $H_2$ without particular excitation of the gases there was obtained a formation of a $Si_3N_4$ layer.

Result: Alternating layer structure.

Core: SiAlON, thereon applied layers of diamond, boron nitride and as outermost layer silicon nitride. Layer thicknesses varyingly adjustable as function of time, in the present case—at which there was 10 h per layer coating time—the layer thickness of diamond was 4 μm, of boron nitride 8 μm and of silicon nitride 6 μm.

I claim:

1. A method of making composite powder particles comprising an inner core, which is enclosed by a coating having a thickness between 0.1 and 5000 μm and comprising a superhard material having a Vickers hardness of more than 3500, which material is different from the core, the core and the coating comprising diamond or modification of diamond, the materials of the core and coating being different in chemical or physical properties with respect to each other characterized in, that the cores are coated in a chemical gas phase deposition procedure by the aid of gas flow in motion, at a temperature between 500° and 1200° C. and a pressure below 500 Torr, at which the gas consists either of a) hydrogen and $CH_4$ or another gaseous or vaporous carbon compound with or without addition of noble gases or b) a gaseous or vaporous boron compound or a boron and nitrogen containing compound with or without hydrogen, nitrogen, halide or noble gas addition and at least one of the gases being supplied by a physical or chemical procedure in an excited state and the gas mixture being brought into contact with a powderous substrate in a CVD-reactor in which solid bodies are floating.

2. A method of preparing a powder of a superhard matter, characterized in, that composite powder particles comprising an inner core, which is enclosed by a coating having a thickness between 0.1 and 5000 µm and comprising a superhard material having a Vickers hardness of more than 3500, which material is different from the core, possibly after preceding disintegration of the particles, are subjected to a chemical reaction, which dissolves the cores of the composite powder particles and the superhard matter remains.

3. The method of claim 1, wherein the superhard material is chemically different from the material of the core.

4. The method of claim 1, characterized in that the outer coating comprises several layers, of which at least one layer comprises mono-crystalline diamond or poly-crystalline diamond.

5. The method of claim 1, wherein the core is small enough to be a homogeneous or heterogeneous nucleus for the crystallization of the superhard material from a gaseous phase which is supersaturated with said superhard material.

6. The method of claim 2, characterized in that the inner core is a mono- or poly-crystalline particle of a modification of boron nitride, or an inorganic material which is essentially non-reactive and non-dissolving with at least one of carbon and boron nitride at temperatures up to 1000° C.

7. A method of making composite powder particles comprising an inner core of hard material which is enclosed by a coating having a thickness between 0.1 and 5000 µm and comprising a superhard material having a Vickers hardness of more than 3500, which material is different from the core, the hard material of the inner core being selected from the group consisting of a carbide, nitride, boride, phosphide, sulphide, silicide, oxide, oxynitride, oxycarbide, oxycarbonitride, a non-oxide silicon ceramic, SiAlON or mixture thereof, characterized in that the cores are coated in a chemical gas phase deposition procedure by the aid of gas flow in motion, at a temperature between 500° and 1200° C. and a pressure below 500 Torr, at which the gas consists either of a) hydrogen and $CH_4$ or another gaseous or vaporous carbon compound with or without addition of noble gases or b) a gaseous or vaporous boron compound or a boron and nitrogen containing compound with or without hydrogen, nitrogen, halide or noble gas addition and at least one of the gases being supplied by a physical or chemical procedure in an excited state and the gas mixture being brought into contact with a powderous substrate in a CVD-reactor in which solid bodies are floating.

8. The method of claim 1, wherein the coating has a thickness between 1 and 5 microns.

9. The method of claim 1, wherein the inner core has a diameter of 0.01 µm to 100 µm and the composite powder particle has an outer diameter between 1 µm and at least 1000 µm.

10. The method of claim 1, wherein the inner core has a diameter of 1 to 10 µm and the composite powder particle has an outer diameter between 10 to 100 µm.

11. The method of claim 2, wherein the coating has a thickness of between 1 and 5 µm.

12. The method of claim 1, wherein the superhard material has a hardness of more than 4500 Vickers.

13. The method of claim 1, wherein the superhard material has a hardness of more than 6000 Vickers.

14. The method of claim 2, wherein the coating has a thickness between 0.1 and 5000 µm and comprises a superhard material having a Vickers hardness of more than 3500, said superhard material being different than material of the inner core, the outer coating comprising several layers, of which at least one layer comprises mono-crystalline diamond, poly-crystalline diamond, or a superhard modification of boron nitride, and in which said superhard material forms a continuous layer and the inner core is selected from the group consisting of a carbide, nitride, boride, phosphide, sulphide, silicide, oxide, oxynitride, oxycarbide, oxycarbonitride, a non-oxide silicon ceramic, SiAlON or mixture thereof.

* * * * *